US 6,800,419 B2

United States Patent
Soyano et al.

(10) Patent No.: US 6,800,419 B2
(45) Date of Patent: Oct. 5, 2004

(54) RADIATION-SENSITIVE RESIN COMPOSITION

(75) Inventors: Akimasa Soyano, Mie (JP); Hiroyuki Ishii, Mie (JP); Hidemitsu Ishida, Mie (JP); Motoyuki Shima, Mie (JP); Yukio Nishimura, Mie (JP)

(73) Assignee: JSR Corporation, Tokyo (JP)

( * ) Notice: Subject to any disclaimer, the term of this patent is extended or adjusted under 35 U.S.C. 154(b) by 57 days.

(21) Appl. No.: 10/369,674

(22) Filed: Feb. 21, 2003

(65) Prior Publication Data

US 2003/0203307 A1 Oct. 30, 2003

(51) Int. Cl.[7] .............................. G03F 7/039; G03F 7/16

(52) U.S. Cl. .................... 430/270.1; 430/905; 430/910; 430/914

(58) Field of Search .............................. 430/270.1, 905, 430/910, 914

(56) References Cited

U.S. PATENT DOCUMENTS 4,491,624 A * 1/1985 Ito et al.
5,071,730 A * 12/1991 Allen et al.
6,303,266 B1 * 10/2001 Okino et al.
6,605,409 B2 * 8/2003 Kodama et al.

FOREIGN PATENT DOCUMENTS

JP 227660 6/1990
JP 4226461 10/1991

* cited by examiner

Primary Examiner—Richard L. Schilling
(74) Attorney, Agent, or Firm—Piper Rudnick LLP; Steven B. Kelber

(57) ABSTRACT

A radiation-sensitive resin composition comprising: (A) an alkali insoluble or scarcely alkali-soluble resin having an acid-dissociable protecting group of the following formula [I],

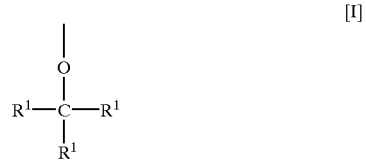

wherein $R^1$ groups are monovalent alicyclic hydrocarbon groups or alkyl groups, provided that at least one of the $R^1$ groups is the monovalent alicyclic hydrocarbon group, or any two of the $R^1$ groups and the carbon atom form a divalent alicyclic hydrocarbon group, (B) a photoacid generator, and (C) propylene glycol monomethyl ether acetate, γ-butyrolactone, and cyclohexanone as solvents. The resin composition is useful as a chemically-amplified resist for microfabrication utilizing deep ultraviolet rays and exhibits excellent film thickness uniformity and storage stability.

19 Claims, No Drawings

RADIATION-SENSITIVE RESIN COMPOSITION

BACKGROUND OF THE INVENTION

1. Field of the Invention

The present invention relates to a radiation-sensitive resin composition suitably used as a chemically-amplified resist useful for microfabrication utilizing various types of radiation represented by deep ultraviolet rays such as a KrF excimer laser and ArF excimer laser, X-rays such as synchrotron radiation, and charged particle beams such as electron beams.

2. Description of Background Art

In the field of microfabrication represented by the manufacture of integrated circuit devices, lithographic technology enabling microfabrication with a line width of 0.20 µm or less has been demanded in order to increase the degree of integration.

In a conventional lithographic process, near ultraviolet rays such as i-line radiation have been generally used. However, it is difficult to perform microfabrication with a line width of sub-quarter micron using near ultraviolet rays.

Therefore, in order to enable microfabrication with a line width of 0.20 µm or less, utilization of radiation with a shorter wavelength has been studied. Deep ultraviolet rays represented by a bright line spectrum of a mercury lamp and an excimer laser, X-rays, electron beams, and the like can be given as radiation with a shorter wavelength. Of these, a KrF excimer laser (wavelength: 248 nm) and an ArF excimer laser (wavelength: 193 nm) have attracted attention.

As a resist applicable to the excimer laser radiation, a number of resists utilizing a chemical amplification effect between a component having an acid-dissociable functional group and a component generating an acid (hereinafter referred to as "photoacid generator") which generates an acid upon irradiation (hereinafter referred to as "exposure") have been proposed. Such a resist is hereinafter called a chemically-amplified resist.

Japanese Patent Publication No. 2-27660 discloses a chemically-amplified resist containing a polymer having a t-butyl ester group of a carboxylic acid or t-butylcarbonate group of a phenol and a photoacid generator. The t-butoxycarbonyl group or t-butylcarbonate group in the polymer dissociates by the action of an acid generated upon exposure, whereby the polymer has an acidic group such as a carboxylic group or a phenolic hydroxyl group. As a result, irradiated areas of the resist film become readily soluble in an alkaline developer.

Most of the conventional chemically-amplified resists use a phenol resin as a base resin. Deep ultraviolet rays used as radiation for exposure are absorbed due to an aromatic ring in the resin and cannot sufficiently reach the lower layers of the resist film. Because of this, the dose of the radiation is greater in the upper layers and is smaller in the lower layers of the resist film. This causes a resist pattern after development to be thinner in the upper part but thicker toward the lower part, resulting in a trapezoid cross-section. No sufficient resolution can be obtained from such a resist film. If the resist pattern after development is in the shape of a trapezoid, desired dimensional accuracy cannot be achieved in a succeeding step such as an etching step or ion implantation step. Moreover, if the shape of the upper part of the resist pattern is not rectangular, the rate of removal of the resist by dry etching is increased, whereby it is difficult to control etching conditions.

The shape of the resist pattern can be improved by increasing the radiation transmittance of the resist film. For example, a (meth)acrylate resin represented by polymethylmethacrylate is a highly desirable resin from the viewpoint of radiation transmittance, because the (meth)acrylate resin has high transparency to deep ultraviolet rays. Japanese Patent Application Laid-open No. 4-226461 discloses a chemically-amplified resist using a methacrylate resin, for example. However, in spite of the excellent microfabrication performance, this composition exhibits poor dry etching resistance due to the absence of an aromatic ring, giving rise to difficulty in performing etching with high accuracy.

When a resist pattern is formed from a chemically-amplified resist composition, the composition is generally dissolved in a suitable organic solvent. The dimensional accuracy of the resist patterns, resolution, and the like are considerably affected by the type and combination of the solvent used for forming resist patterns. Moreover, when a composition solution is applied to a substrate by a spin coating method, for example, the surface of the coated resist film is not necessarily sufficiently uniform because of inadequate wettability of the composition with the substrate, giving rise to insufficient uniformity of film thickness. Furthermore, when the composition is stored as a solution, the combination of the resin and solvent affects the stability of the solution. Some compositions solution produce foreign matters during storage.

Various types of solvents such as ethers, glycol ethers, glycol ether acetates, cellosolve esters, aromatic hydrocarbons, ketones, and other esters have conventionally been used as solvents for the chemically-amplified resist composition solutions. However, it has been difficult to discover an optimal combination of the resin and solvent because of many types of solvents.

An object of the present invention is to provide a radiation-sensitive resin composition useful as a chemically-amplified resist having high transmittance of radiation and exhibiting superior basic properties as a resist such as high sensitivity and resolution and, at the same time, exhibiting excellent pattern configuration, film thickness uniformity, and storage stability.

SUMMARY OF THE INVENTION

The above object can be achieved in the present invention by a radiation-sensitive resin composition comprising:

(A) an alkali insoluble or scarcely alkali-soluble resin having an acid-dissociable protecting group of the following formula [I],

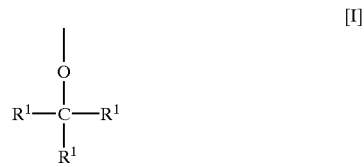

wherein $R^1$ groups individually represent a monovalent alicyclic hydrocarbon group having 4–20 carbon atoms or a derivative thereof, or a linear or branched alkyl group having 1–4 carbon atoms, provided that at least one of the $R^1$ groups is the monovalent alicyclic hydrocarbon group having 4–20 carbon atoms or a derivative thereof, or any two of the $R^1$ groups form, in combination and together with the carbon atom to which the two $R^1$ groups bond, a divalent alicyclic hydrocarbon group having 4–20 carbon atoms or a derivative thereof, with the remaining $R^1$ group being the linear or branched alkyl group having 1–4 carbon atoms or the monovalent alicyclic hydrocarbon group having 4–20 carbon atoms or the derivative thereof, (B) a photoacid generator, and (C) propylene glycol monomethyl ether acetate, γ-butyrolactone, and cyclohexanone as solvents.

In a preferred embodiment of the present invention, the above acid-dissociable protecting group of the formula [I] in the resin (A) is selected from the groups of the following formulas [I-1], [I-2], and [I-3].

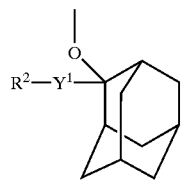

[I-1]

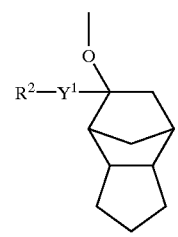

[I-2]

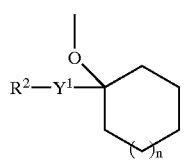

[I-3]

wherein the $R^2$ group individually represents a hydrogen atom, a linear or branched alkyl group having 1–10 carbon atoms, a monovalent oxygen-containing organic group having 1–6 carbon atoms, $Y^1$ individually represents a single bond or a group —$CH_2$—, and n is an integer of 0–2.

The $R^2$ group in the formulas [I-1], [I-2], and [I-3] is preferably selected from the group consisting of a methyl group, ethyl group, n-butyl group, and n-butoxy group.

The $Y^1$ group in the formulas [I-1], [I-2], and [I-3] is preferably a single bond.

n in the formulas [I-1], [I-2], and [I-3] is preferably 0 or 1.

In another preferred embodiment, the acid-dissociable protecting group of the formula [I] in the resin (A) is included in the recurring unit of the following formula (1),

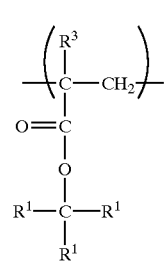

(1)

wherein $R^1$ is the same as defined in the formula [I] and $R^3$ represents a hydrogen atom or a methyl group.

The amount of the recurring unit of the above formula (1) is preferably 10–60 mol % of the total recurring units in the resin (A).

In the recurring unit of the above formula (1), the group:

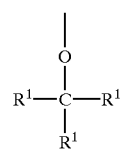

[I]

is preferably dissociable in the presence of an acid and produces a carboxyl group.

The above resin (A) preferably comprises the recurring unit of the formula (1) and at least one of the recurring units of the following formulas (2-1), (2-2), (2-3), and (2-4),

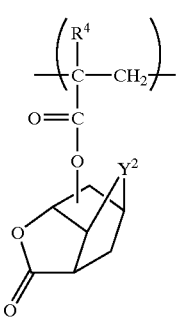

(2-1)

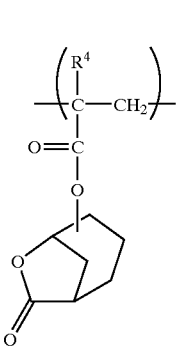

(2-2)

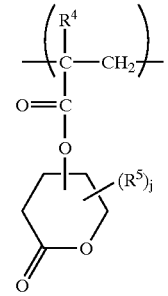

(2-3)

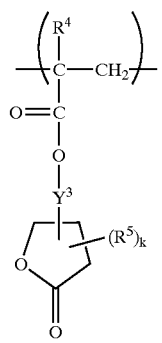

(2-4)

wherein $R^4$ individually represents a hydrogen atom or a methyl group, $Y^2$ represents a group —$CH_2$—, —CH($CH_3$)—, —C($CH_3$)$_2$—, —O—, or —S—, $R^5$ individually represents a linear or branched alkyl group having 1–5 carbon atoms or a linear or branched alkoxyl group having 1–5 carbon atoms, j is an integer of 0 to 4, and k is an integer of 0 to 4; two or more $R^5$ groups, present in the formula (2-3) or formula (2-4), being either the same or different, and $Y^2$ represents a single bond or a group —$CH_2$—.

The content of the above recurring units of the formulas (2-1), (2-2), (2-3), and (2-4) is preferably 10–80 mol % of the total recurring units in the resin (A).

In a preferred embodiment of the radiation-sensitive resin composition of the present invention, the photoacid generator (B) comprises a compound of the following formula (3),

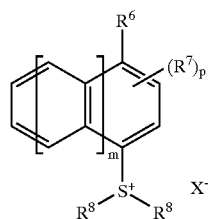

(3)

wherein $R^6$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^7$ indicates a hydrogen atom or a linear or branched alkyl group having 1–10 carbon atoms, two or more $R^7$ groups, if present, being either the same or different, p is an integer of 0–3, $R^8$ individually represents a linear or branched alkyl group having 1–10 carbon atoms, a phenyl group or naphtyl group which may have a substituent, or two $R^8$ groups bond, together with the sulfur atom to which the two $R^8$ groups bond, to form a substituted or unsubstituted 3–11 member cyclic structure, m is an integer of 0–2, and $X^-$ represents a linear or branched perfluoroalkane sulfonic acid anion having 1–10 carbon atoms.

The $X^-$ group in the formula (3) is preferably at least one anion selected from the group consisting of a trifluoromethanesulfonic acid anion, nonafluoro-n-butanesulfonic acid anion, and perfluoro-n-octanesulfonic acid anion.

In another preferred embodiment of the present invention, the radiation-sensitive resin composition further comprises (D) a polycyclic compound of the formula —$COOR^9$, having a molecular weight of 1,000 or less, wherein $R^9$ represents a hydrogen atom, a linear or branched, substituted or unsubstituted alkyl group having 1–20 carbon atoms, a substituted or unsubstituted monovalent alicyclic hydrocarbon group having 3–20 carbon atoms, or a group —$CH_2COOR^{10}$, wherein $R^{10}$ represents a hydrogen atom, a linear or branched, substituted or unsubstituted alkyl group having 1–20 carbon atoms, or a substituted or unsubstituted monovalent alicyclic hydrocarbon group having 3–20 carbon atoms.

The above polycyclic compound is preferably selected from the group consisting of the compounds of the following formulas (4) and (5):

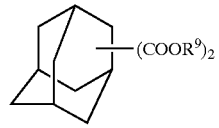

(4)

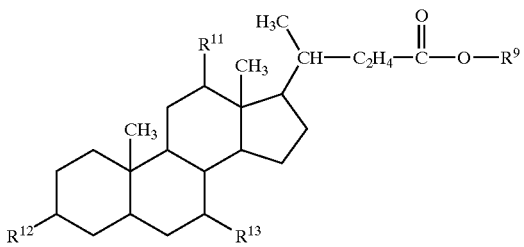

(5)

wherein $R^{11}$, $R^{12}$, and $R^{13}$ individually represent a hydrogen atom or a hydroxyl group, provided that at least one of the groups $R^{11}$, $R^{12}$, and $R^{13}$ is a hydroxyl group.

The content of the above polycyclic compound is preferably 1–20 parts by weight per 100 parts by weight of the resin (A).

In sill another embodiment of the present invention, the radiation-sensitive resin composition, the content of propylene glycol monomethyl ether acetate, γ-butyrolactone, and cyclohexanone is respectively in the range of 10–89 wt %, 1–40 wt %, and 10–89 wt %.

The resin (A) in the radiation-sensitive resin composition of the present invention preferably has a polystyrene-reduced weight average molecular weight determined by gel permeation chromatography of 3,000–30,000.

The radiation-sensitive resin composition of the present invention is preferably dissolved in the solvent to make the solid component concentration in the range of 5 to 50 wt %.

In a further preferred embodiment of the radiation-sensitive resin composition, the content of the acid generator (B) is preferably 0.1–20 parts by weight per 100 parts by weight of the resin (A).

Other objects, features and advantages of the invention will hereinafter become more readily apparent from the following description.

DETAILED DESCRIPTION OF THE INVENTION AND PREFERRED EMBODIMENTS

The present invention will be described in detail below.

Resin (A)

The component (A) of the present invention is an alkali insoluble or scarcely alkali-soluble resin (hereinafter referred to as "resin (A)") having an acid-dissociable protecting group of the above-described formula [I] (hereinafter referred to as "acid-dissociable protecting group (I)").

The term "alkali insoluble" or "scarcely alkali-soluble" used herein indicates the following properties of a resin. In the case of developing a film using only the resin (A) in stead of a resist film under alkaline development conditions employed when forming a resist pattern of the resist film formed from a radiation-sensitive resin composition containing the resin (A), the term "alkali insoluble" or "scarcely alkali-soluble" refers to properties in which 50% or more of the initial thickness of the resist film remains after development.

In the formula [I], as examples of the monovalent alicyclic hydrocarbon group having 4–20 carbon atoms represented by $R^1$ and the divalent alicyclic hydrocarbon group having 4–20 carbon atoms formed by two $R^1$ groups in combination, alicyclic groups derived from cycloalkanes such as norbornane, tricyclodecane, tetracyclododecane, adamantane, cyclobutane, cyclopentane, cyclohexane, cycloheptane, and cyclooctane, and groups obtained by replacing hydrogen atoms on these alicyclic groups with one or more linear, branched, or unbranched alkyl groups having 1–4 carbon atoms, such as methyl group, ethyl group, n-propyl group, i-propyl group, n-butyl group, 2-methyl propyl group, 1-methyl propyl group, and t-butyl group, can be given.

As examples of derivatives of the monovalent or divalent alicyclic hydrocarbon groups, groups having at least one substituent such as a hydroxyl group; a carboxyl group; an oxo group (=O); hydroxyalkyl groups having 1–4 carbon atoms such as a hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl groups having 1–4 carbon atoms such as a methoxy group, ethoxy group, n-propoxy group, i-propoxy group, n-butoxy group, 2-methylpropbxy group, 1-methylpropoxy group, and t-butoxy group; a cyano group; and cyanoalkyl groups having 2–5 carbon atoms such as a cyanomethyl group, 2-cyanoethyl group, 3-cyanopropyl group, and 4-cyanobutyl group can be given.

Of these substituents, a hydroxyl group, carboxyl group, hydroxymethyl group, cyano group, cyanomethyl group, and the like are preferable.

As examples of the linear or branched alkyl group having 1–4 carbon atoms represented by $R^1$, a methyl group, ethyl group, n-propyl group, i-propyl group, n-butyl group, 2-methylpropyl group, 1-methylpropyl group, and t-butyl group can be given.

Of these alkyl groups, a methyl group and an ethyl group are preferable.

As preferable acid-dissociating protecting group (I) in the present invention, groups of the following formula [I-1] (hereinafter referred to as "an acid-dissociable protective group [I-1]"), the following formula [I-2] (hereinafter referred to as "an acid-dissociable group [I-2]"), the following formula [I-3] (hereinafter referred to as "an acid-dissociable group [I-3]"), and the like can be given.

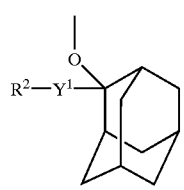

[I-1]

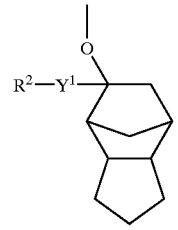

[I-2]

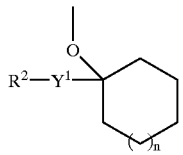

[I-3]

wherein the $R^2$ group individually represents a hydrogen atom, a linear or branched alkyl group having 1–10 carbon atoms, a monovalent oxygen-containing organic group having 1–6 carbon atoms, $Y^1$ individually represents a single bond or a group —CH$_2$—, and n is an integer of 0–2.

As examples of the linear or branched alkyl group having 1–10 carbon atoms represented by $R^2$ in the formulas [I-1], [I-2], and [I-3], a methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, n-decyl group, and the like can be given.

Of these alkyl groups, a methyl group, ethyl group, and the like are preferable.

As examples of the monovalent oxygen-containing organic group having 1–6 carbon atoms represented by $R^2$, a linear or branched alkoxyl group, alkoxycarbonyl group, hydroxyalkyl group, and alkoxyalkoxyl group can be given.

As examples of the alkoxyl group, a methoxy group, ethoxy group, n-propoxy group, i-propoxy group, n-butoxy group, 2-methylpropoxy group, 1-methylpropoxy group, t-butoxy group, n-pentyloxy group, neopentyloxy group, n-hexyloxy group, n-heptyloxy group, n-octyloxy group, 2-ethylhexyloxy group, n-nonyloxy group, and n-decyloxy group can be given.

Of these alkoxyl groups, a methoxy group, ethoxy group, and the like are preferable.

As examples of the alkoxycarbonyl group, a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, neopentyloxycarbonyl group, n-hexyloxycarbonyl group, n-heptyloxycarbonyl group, n-octyloxycarbonyl group, 2-ethylhexyloxycarbonyl group, n-nonyloxycarbonyl group, and n-decyloxycarbonyl group can be given.

Of these alkoxylcarbonyl groups, a methoxycarbonyl group, ethoxycarbonyl group, and the like are preferable.

As examples of the hydroxyalkyl group, a hydroxymethyl group, 1-hydroxyethyl group, 2-hydroxyethyl group, 3-hydroxypropyl group, 4-hydroxybutyl group, 5-hydroxypentyl group, 6-hydroxyhexyl group, and the like can be given.

Of these hydroxyalkyl groups, a hydroxymethyl group, 2-hydroxyethyl group, and the like are preferable.

As examples of the alkoxyalkoxyl group, a methoxymethoxy group, ethoxymethoxy group, 2-methoxyethoxy group, 2-ethoxyethoxy group, 3-methoxypropoxy group, 4-methoxybutoxy group, 5-methoxypentyloxy group, and 6-methoxyhexyloxy group can be given.

Of these alkoxyl groups, a methoxymethoxy group, ethoxymethoxy group, 2-methoxyethoxy group, 2-ethoxyethoxy group, and the like are preferable.

Particularly preferable groups for $R^2$ in the formulas [I-1] to [I-3] are a methyl group, ethyl group, n-butyl group, n-butoxy group, and the like.

A single bond is preferable for $Y^1$ in the formulas [I-1] to [I-3].

n in the formula [I-1] to [I-3] is preferably either 0 or 1.

The resin (A) is not specifically limited as long as the resins satisfy the above requirements, and may be an addition polymerization resin, a polyaddition resin, a polycondensation resin, or a ring-opening polymerization resin. However, such a resin is preferably an addition polymerization resin, and more preferably a resin in which the acid-dissociable protecting group (I) is included in the recurring unit of the following formula (1) (hereinafter referred to as "recurring unit (1)"). This resin is hereinafter referred to as "resin (α)".

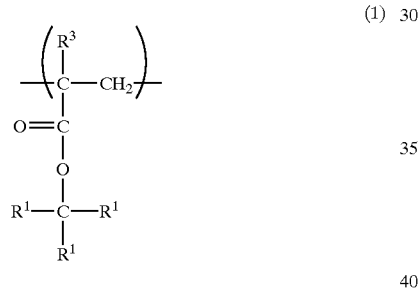

(1)

wherein $R^1$ is the same as defined in the formula [I] and $R^3$ represents a hydrogen atom or a methyl group.

The group $-COOC(R^1)_3$ in the recurring unit (1) is an acid-dissociable group which dissociates in the presence of an acid and produces a carboxyl group. This acid-dissociable group is referred to as "an acid-dissociable group (i)" in the following description.

As examples of the acid-dissociable group (i) other than the groups in which the acid-dissociating protecting group [I-1], acid-dissociating protecting group [I-2], or acid-dissociating protecting group [I-3] bonds to a carbonyl group, groups of the following formulas (i-1) to (i-33) can be given.

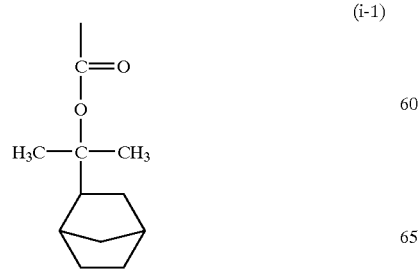

(i-1)

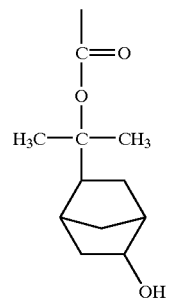

(i-2)

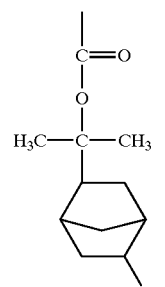

(i-3)

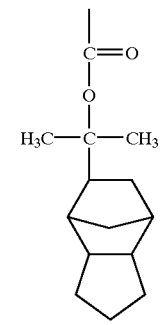

(i-4)

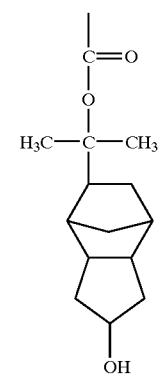

(i-5)

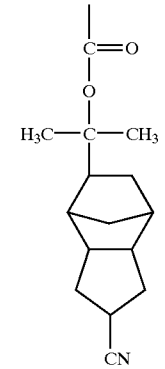

(i-6)

(i-7) 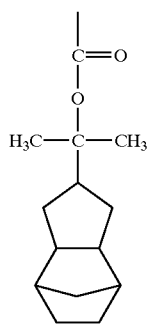
(i-8) 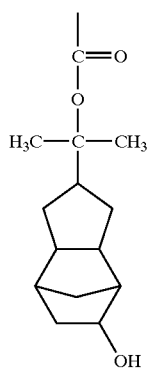
(i-9) 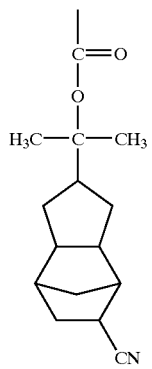
(i-10) 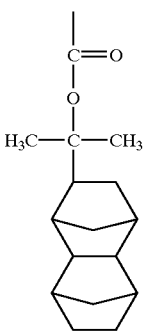
(i-11) 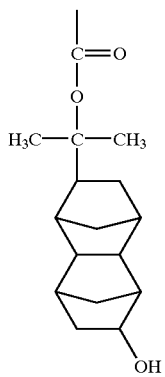
(i-12) 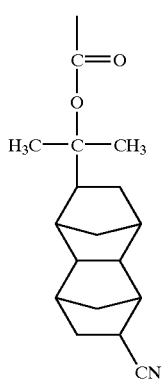
(i-13) 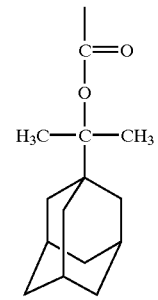
(i-14) 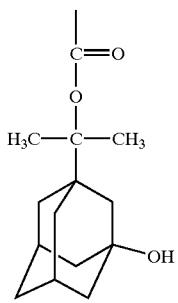

-continued
(i-15)
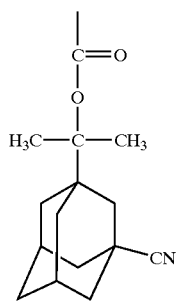
(i-16)
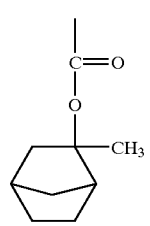
(i-17)
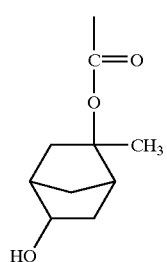
(i-18)
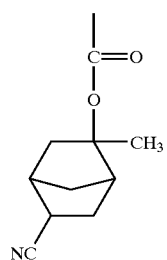
(i-19)
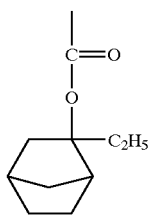
(i-20)
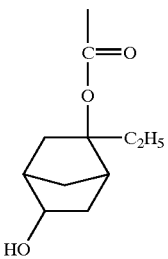
-continued
(i-21)
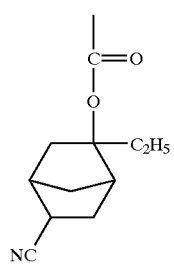
(i-22)
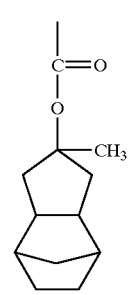
(i-23)
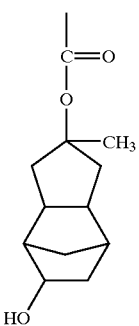
(i-24)
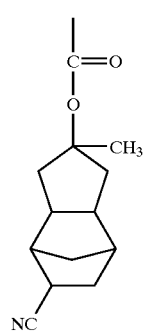
(i-25)
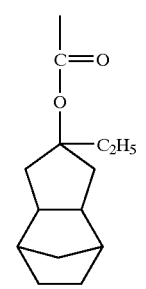

(i-26) 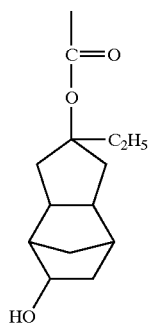

(i-27) 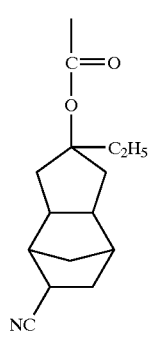

(i-28) 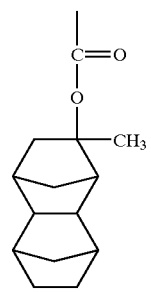

(i-29) 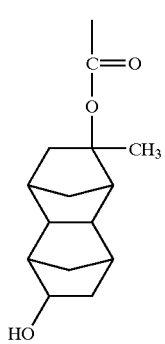

(i-30) 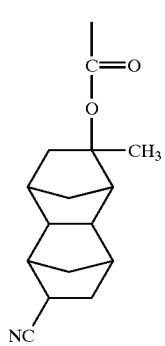

(i-31) 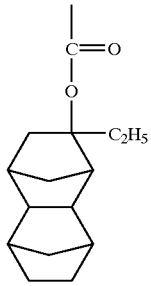

(i-32) 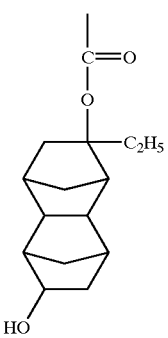

(i-33) 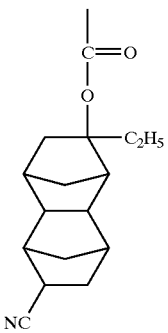

As the acid-dissociable group (i) in the resin (α), 2-methyl-2-adamantyloxycarbonyl group, 2-ethyl-2-adamantyloxycarbonyl group, 1-methylcyclopentyloxycarbonyl group, 1-ethylcyclopentyloxycarbonyl group, 1-methylcyclohexyloxycarbonyl group, 1-ethylcyclohexyloxycarbonyl group, the groups of the formulas (i-1), (i-20), (i-13), (i-16), and the like are preferable.

The recurring unit (1) may be used in the resin (α) either individually or in combination of two or more.

The resin (α) can comprise one or more recurring units other than the recurring unit (1) (hereinafter referred to as "other recurring units").

As preferable examples of the other recurring units in the resin (α), a recurring unit of the following formula (2-1) (hereinafter called "recurring unit (2-1)"), a recurring unit of the following formula (2-2) (hereinafter called "recurring unit (2-2)"), a recurring unit of the following formula (2-3) (hereinafter called "recurring unit (2-3)"), and a recurring unit of the following formula (2-4) (hereinafter called "recurring unit (2-4)") can be given.

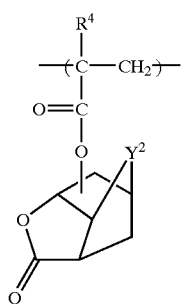

(2-1)

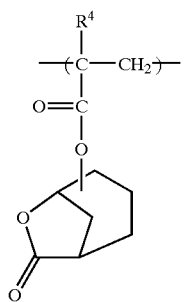

(2-2)

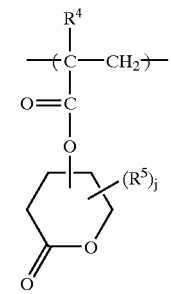

(2-3)

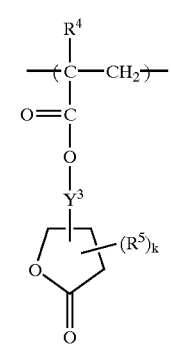

(2-4)

wherein $R^4$ individually represents a hydrogen atom or a methyl group, $Y^2$ represents a group —$CH_2$—, —CH($CH_3$)—, —C($CH_3$)$_2$—, —O—, or —S—, $R^5$ individually represents a linear or branched alkyl group having 1–5 carbon atoms or a linear or branched alkoxyl group having 1–5 carbon atoms, j is an integer of 0–4, k is an integer of 0–4, two or more groups $R^5$, which may be present in the formula (2-3) or formula (2-4), being either identical or different, and $Y^3$ represents a single bond or a group —$CH_2$—.

A group —$CH_2$— and the like are preferable as $Y^2$ in the formula (2-1).

As examples of the linear or branched alkyl group having 1–5 carbon atoms represented by $R^5$ in the formulas (2-3) and (2-4), a methyl group, ethyl group, n-propyl group, i-propyl group, n-butyl group, 2-methylpropyl group, 1-methylpropyl group, t-butyl group, n-pentyl group, and the like can be given.

Of these alkyl groups, a methyl group, ethyl group, and the like are preferable.

As examples of the linear or branched alkoxyl group having 1–5 carbon atoms represented by $R^5$ in the formulas (2-3) and (2-4), a methoxy group, ethoxy group, n-propoxy group, i-propoxy group, n-butoxy group, 2-methylpropoxy group, 1-methylpropoxy group, t-butoxy group, n-pentyloxy group, and the like can be given.

Of these alkoxyl groups, a methoxy group, ethoxy group, and the like are preferable.

Particularly preferable groups for $R^5$ in the formula (2-3) are a hydrogen atom, methyl group, methoxy group and the like.

i in the formula (2-3) is preferably either 0 or 1.

Particularly preferable groups for $R^5$ in the formula (2-4) are a hydrogen atom, methyl group, methoxy group and the like.

k in the formula (2-4) is preferably 0 to 2.

As examples of the recurring units other than the recurring units (2-1) to (2-4), recurring units obtained by the cleavage of a polymerizable unsaturated bond of the following compounds can be given: monofunctional monomers, which include (meth)acrylates having a bridged hydrocarbon skeleton such as norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, 3-hydroxy-1-adamantyl (meth)acrylate, and adamantylmethyl (meth)acrylate; carboxyl group-containing esters having a bridged hydrocarbon skeleton of an unsaturated carboxylic acid such as carboxynorbornyl (meth)acrylate, carboxytricyclodecanyl (meth)acrylate, and carboxytetracyclodecanyl (meth)acrylate; (meth)acrylates having no bridged hydrocarbon skeleton such as methyl (meth)acrylate, ethyl (meth)acrylate, n-propyl (meth)acrylate, n-butyl (meth)acrylate, 2-methylpropyl (meth)acrylate, 1-methylpropyl (meth)acrylate, t-butyl (meth)acrylate, 2-hydroxyethyl (meth) acrylate, 2-hydroxypropyl (meth)acrylate, 3-hydroxypropyl (meth)acrylate, cyclopropyl (meth)acrylate, cyclopentyl (meth)acrylate, cyclohexyl (meth)acrylate, 4-methoxycyclohexyl (meth)acrylate, 2-cyclopentyloxycarbonylethyl (meth)acrylate, 2-cyclohexyloxycarbonylethyl (meth)acrylate, and 2-(4-methoxycyclohexyl)oxycarbonylethyl (meth)acrylate; α-hydroxymethylacrylic acid esters such as methyl α-hydroxymethyl acrylate, ethyl α-hydroxymethyl acrylate, n-propyl α-hydroxymethyl acrylate, and n-butyl α-hydroxymethyl acrylate; unsaturated nitryl compounds such as (meth) acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-(meth)acryloylmorpholine, N-vinyl-ε-caprolactam, N-vinylpyrrolidone, vinylpyridine, and vinylimidazole; unsaturated carboxylic acids (anhydrides) such as a (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acid having no bridged hydrocarbon skeleton such as 2-carboxyethyl (meth)acrylate, 2-carboxypropyl (meth)acrylate, 3-carboxypropyl (meth)acrylate, 4-carboxybutyl (meth)

acrylate, and 4-carboxycyclohexyl (meth)acrylate, and polyfunctional monomers, which include polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate; and polyfunctional monomers having no bridged hydrocarbon skeleton such as methylene glycol di(meth)acrylate, ethylene glycol di(meth)acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth)acrylate, 1,4-bis(2-hydroxypropyl) benzene di(meth)acrylate, and 1,3-bis(2-hydroxypropyl) benzene di(meth)acrylate.

Of these recurring units, units obtained by cleavage of a polymerizable unsaturated bond of (meth)acrylate having a bridged hydrocarbon skeleton are preferable, with particularly preferable units being units obtained by cleavage of a polymerizable unsaturated bond such as 3-hydroxy-1-adamantyl(meth)acrylate.

In the resin (α), these other recurring units may be present either individually or in combination of two or more.

The amount of the recurring unit (1) in the resin (α) is usually 10 to 60 mol %, preferably 10 to 50 mol %, and still more preferably 15 to 45 mol % of the total amount of the recurring units. If the amount of the recurring unit (1) is less than 10 mol %, resolution as a resist tends to decrease. If more than 60 mol %, developability tends to decrease.

The content of other recurring units is usually 50 mol % or less, and preferably 30 mol % or less of the total content of the recurring units.

When the resin (α) has units selected from the group consisting of the recurring unit (1), recurring unit (2-1), recurring unit (2-2), recurring unit (2-3), and recurring unit (2-4), the amount of the recurring unit (1) is usually 10–60 mol %, preferably 10–50 mol %, and still more preferably 15–45 mol % of the total amount of the recurring units. The total amount of the recurring units (2-1) to (2-4) is usually 10–80 mol %, preferably 20–80 mol %, and still more preferably 20–70 mol % of the total amount of the recurring units. The amount of the recurring units other than the recurring units (2-1) to (2-4) is usually 50 mol % or less, and preferably 30 mol or less of the total amount of the recurring units.

If the amount of the recurring unit (1) is less than 10 mol %, resolution tends to decrease. If more than 60 mol %, developability tends to decrease. If the total amount of the recurring units (2-1) to (2-4) is less than 10 mol %, not only does adhesion of the resist to substrates tend to decrease, but also developability is impaired. If the amount exceeds 80 mol %, not only is resolution impaired, but also solubility of the composition in a solvent may decrease.

The resin (α) may be prepared by polymerizing the polymerizable unsaturated monomers corresponding to each recurring unit in an appropriate solvent using radical polymerization initiators such as hydroperoxides, dialkyl peroxides, diacyl peroxides, and azo compounds in the presence of a chain transfer agent, as required.

As examples of the solvent used for the polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; and ethers such as tetrahydrofuran, dimethoxyethanes, and diethoxyethanes can be given.

These solvents may be used either individually or in combinations of two or more.

The polymerization temperature is usually 40–120° C., and preferably 50–90° C. The reaction time is usually 1–48 hours, and preferably 1–24 hours.

The polystyrene-reduced weight average molecular weight (hereinafter referred to as "Mw") of the resin (A) determined by gel permeation chromatography (GPC) is usually 3,000–30,000, preferably 5,000–30,000, and still more preferably 5,000–20,000. If the Mw of the resin ($A_1$) and the resin ($A_2$) is less than 3,000, heat resistance of the resulting resist may be decreased. If the Mw exceeds 30,000, developability of the resulting resist may be decreased.

The ratio of Mw to the polystyrene-reduced number average molecular weight (hereinafter referred to as "Mn") determined by gel permeation chromatography (GPC) (Mw/Mn) of the resin (A) is usually 1–5, and preferably 1–3.

The content of impurities such as halogens and metals in the resin (A) is preferably as small as possible. The smaller the content of impurities, the more improved the sensitivity, resolution, process stability, pattern shape, and the like of the resulting resist. The resin (A) may be purified by using a chemical purification process such as washing with water or liquid-liquid extraction or a combination of the chemical purification process and a physical purification process such as ultrafiltration or centrifugation, for example.

In the present invention, the resin (A) may be used either individually or in combination of two or more.

Acid Generator (B)

The component (B) of the present invention is a photoacid generator which generates an acid upon exposure (hereinafter referred to as "acid generator (B)").

The acid generator (B) causes the acid-dissociating protective group in the resin (A) to dissociate by the action of an acid generated upon exposure. As a result, exposed areas of the resist film become readily soluble in an alkaline developer, whereby a positive-tone resist pattern is formed.

The component (B) of the present invention preferably comprises a compound represented by the following formula (3) (hereinafter referred to as "an acid generator (3)").

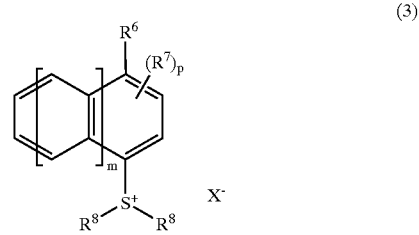

(3)

wherein $R^6$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^7$ indicates a hydrogen atom or a linear or branched alkyl group having 1–10 carbon atoms, two or more $R^7$ groups, if present, being either the same or different, p is an integer of 0–3, $R^8$ individually represents a linear or branched alkyl group having 1–10 carbon atoms or a phenyl group or naphtyl group which may have a substituent, or two $R^8$ groups bond, together with the sulfur atom to which the two $R^8$ groups bond, to form a substituted or unsubstituted 3–11 member cyclic structure, m is an integer of 0–2, and X⁻ represents a linear or branched perfluoroalkane sulfonic acid anion having 1–10 carbon atoms.

In the formula (3), as examples of the linear or branched alkyl group having 1–10 carbon atoms represented by $R^6$, $R^7$, or $R^8$, a methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, and n-decyl group can be given.

Of these alkyl groups, a methyl group, ethyl group, n-propyl group, n-butyl group, t-butyl group, and the like are preferable.

As examples of the linear or branched alkoxyl group having 1–10 carbon atoms represented by $R^6$, a methoxy group, ethoxy group, n-propoxy group, i-propoxy group, n-butoxy group, 2-methylpropoxy group, 1-methylpropoxy group, t-butoxy group, n-pentyloxy group, neopentyloxy group, n-hexyloxy group, n-heptyloxy group, n-octyloxy group, 2-ethylhexyloxy group, n-nonyloxy group, and n-decyloxy group can be given.

Of these alkoxyl groups, a methoxy group, ethoxy group, n-butoxy group, and the like are preferable.

As examples of the linear or branched alkoxycarbonyl group having 2–11 carbon atoms represented by $R^6$, a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, n-pentyloxycarbonyl group, neopentyloxycarbonyl group, n-hexyloxycarbonyl group, n-heptyloxycarbonyl group, n-octyloxycarbonyl group, 2-ethylhexyloxycarbonyl group, n-nonyloxycarbonyl group, and n-decyloxycarbonyl group can be given.

Of these alkoxycarbonyl groups, a methoxycarbonyl group, ethoxycarbonyl group, n-butoxycarbonyl group, and the like are preferable.

Preferable groups for $R^6$ in the formula (3) are a hydrogen atom, methyl group, ethyl group, hydroxyl group, methoxy group, ethoxy group, and n-butoxy group, and the like.

As $R^7$ in the formula (3), a hydrogen atom, methyl group, ethyl group, n-butyl group, t-butyl group, and the like are preferable.

p in the formula (3) is preferably 0 to 2.

As examples of the phenyl group which may be substituted represented by $R^8$ in the formula (3), a phenyl group; alkyl-substituted phenyl groups which may be substituted by a linear, branched, or cyclic alkyl group having 1–10 carbon atoms, such as o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, and 4-ethylphenyl group; and groups obtained by substituting the phenyl group or alkyl-substituted phenyl groups with one or more groups such as a hydroxyl group, carboxyl group, cyano group, nitro group, alkoxyl group, alkoxyalkyl group, alkoxycarbonyl group, and alkoxycarbonyloxy group can be given.

As examples of the alkoxyl group as the substituent for the phenyl group or alkyl-substituted phenyl groups, linear, branched, or cyclic alkoxyl groups having 1–20 carbon atoms such as a methoxy group, ethoxy group, n-propoxy group, i-propoxy group, n-butoxy group, 2-methylpropoxy group, 1-methylpropoxy group, t-butoxy group, cyclopentyloxy group, and cyclohexyloxy group can be given.

As examples of the alkoxyalkyl group, linear, branched, or cyclic alkoxyalkyl groups having 2–21 carbon atoms such as a methoxymethyl group, ethoxymethyl group, 1-methoxyethyl group, 2-methoxyethyl group, 1-ethoxyethyl group, and 2-ethoxyethyl group can be given.

As examples of the alkoxycarbonyl group, linear, branched, or cyclic alkoxycarbonyl groups having 2–21 carbon atoms such as a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, t-butoxycarbonyl group, cyclopentyloxycarbonyl group, and cyclohexyloxycarbonyl group can be given.

As examples of the alkoxycarbonyloxy group, linear, branched, or cyclic alkoxycarbonyloxy groups having 2–21 carbon atoms such as a methoxycarbonyloxy group, ethoxycarbonyloxy group, n-propoxycarbonyloxy group, i-propoxycarbonyloxy group, n-butoxycarbonyloxy group, t-butoxycarbonyloxy group, cyclopentyloxycarbonyl group, and cyclohexyloxycarbonyl group can be given.

As the phenyl group which may have a substituent represented by $R^8$ in the formula (3), a phenyl group, methoxyphenyl group, and the like are preferable.

As examples of the substituted or unsubstituted naphthyl group represented by $R^8$ in the formula (3), naphthyl groups such as a 1-naphthyl group and 2-naphthyl group; naphthyl group derivatives obtained by substituting a hydrogen atom in the naphthyl group with a linear, branched, or cyclic alkyl group having 1–10 carbon atoms, such as 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 1-methyl-2-naphthyl group, 3-methyl-2-naphtyl group, and 4-methyl-2-naphthyl group; and the groups obtained by further substituting one or more hydrogen atoms in the naphthyl group or alkyl-substituted naphthyl groups with one or more groups such as a hydroxyl group, carboxyl group, cyano group, nitro group, alkoxyl group, alkoxyalkyl group, alkoxycarbonyl group, and alkoxycarbonyloxy group can be given.

As examples of the alkoxyl group, alkoxyalkyl group, alkoxycarbonyl group, and alkoxycarbonyloxy group substituted on the naphthyl group or alkyl-substituted naphthyl groups, those groups previously mentioned for the phenyl group and alkyl-substituted phenyl groups can be given.

As naphthyl groups which may have a substituent represented by $R^8$ in the formula (3), a 1-naphthyl group and the like are preferable.

As the 3–11 member cyclic structure formed by two $R^8$ groups bonded together, a 5 or 6 member cyclic structure is preferable, and the particularly preferable structure is a 5 member cyclic structure (i.e. tetrahydrothiophene cyclic structure).

As examples of substituents for the above cyclic structure, the groups previously mentioned for the phenyl group and alkyl-substituted phenyl groups, such as a hydroxyl group, carboxyl group, cyano group, nitro group, alkoxyl group, alkoxyalkyl group, alkoxycarbonyl group, and alkoxycarbonyloxy group can be given.

As the $R^8$ group in the formula (3), a methyl group, ethyl group, phenyl group, methoxyphenyl group, 1-naphthyl group, a group with a tetrahydrothiophene cyclic structure formed from the two $R^8$ groups bonded together and the sulfur atom, and the like are particularly preferable.

m in the formula (3) is preferably either 0 or 1.

In the formula (3), as the linear or branched perfluoroalkanesulfonic acid anion having 1–10 carbon atoms represented by $X^-$, trifluoromethanesulfonic acid anion, nonafluoro-n-butanesulfonic acid anion, and perfluoro-n-octanesulfonic acid anion are preferable.

Specific examples of preferable acid generator (3) include: triphenylsulfonium trifluoromethanesulfonate, triphenylsulfonium nonafluoro-n-butanesulfonate, triphenylsulfonium perfluoro-n-octanesulfonate, 1-naphthyldimethylsulfonium trifluoromethanesulfonate, 1-naphthyldimethylsulfonium nonafluoro-n-butanesulfonate, 1-naphthyldimethylsulfonium perfluoro-n-octanesulfonate, 1-naphthyldiethylsulfonium trifluoromethanesulfonate, 1-naphthyldiethylsulfonium nonafluoro-n-butanesulfonate, 1-naphthyldiethylsulfonium perfluoro-n-octanesulfonate, 1-(4-hydroxynaphthyl)dimethylsulfonium trifluoromethanesulfonate, 1-(4-hydroxynaphthyl)dimethylsulfonium nonafluoro-n-butanesulfonate, 1-(4-hydroxynaphthyl)dimethylsulfonium perfluoro-n-octanesulfonate, 1-(4-hydroxynaphthyl)diethylsulfonium trifluoromethanesulfonate, 1-(4-hydroxynaphthyl)diethylsulfonium nonafluoro-n-butanesulfonate, 1-(4-hydroxynaphthyl)diethylsulfonium perfluoro-n-octanesulfonate, 1-(4-cyanonaphthyl)dimethylsulfonium trifluoromethanesulfonate, 1-(4-cyanonaphthyl)dimethylsulfonium nonafluoro-n-butanesulfonate, i-(4-cyanonaphthyl)dimethylsulfonium perfluoro-n-octanesulfonate, 1-(4-cyanonaphthyl)diethylsulfonium trifluoromethanesulfonate, 1-(4-cyanonaphthyl)diethylsulfonium nonafluoro-n-butanesulfonate, 1-(4-cyanonaphthyl)diethylsulfonium perfluoro-n-octanesulfonate, 1-(4-nitronaphthyl)dimethylsulfonium trifluoromethanesulfonate, 1-(4-nitronaphthyl)dimethylsulfonium nonafluoro-n-butanesulfonate, 1-(4-nitronaphthyl)dimethylsulfonium perfluoro-n-octanesulfonate, 1-(4-nitronaphthyl)diethylsulfonium trifluoromethanesulfonate, 1-(4-nitronaphthyl)diethylsulfonium nonafluoro-n-butanesulfonate, 1-(4-nitronaphthyl)diethylsulfonium perfluoro-n-octanesulfonate, 1-(4-methylnaphthyl)dimethylsulfonium trifluoromethanesulfonate, 1-(4-methylnaphthyl)dimethylsulfonium nonafluoro-n-butanesulfonate, 1-(4-methylnaphthyl)dimethylsulfonium perfluoro-n-octanesulfonate, 1-(4-methylnaphthyl)diethylsulfonium trifluoromethanesulfonate, 1-(4-methylnaphthyl)diethylsulfonium nonafluoro-n-butanesulfonate, 1-(4-methylnaphthyl)diethylsulfonium perfluoro-n-octanesulfonate, 1-(4-hydroxynaphthalen-1-yl)tetrahydrothiophenium trifluoromethanesulfonate, 1-(4-hydroxynaphthalen-1-yl)tetrahydrothiophenium nonafluoro-n-butanesulfonate, 1-(4-hydroxynaphthalen-1-yl)tetrahydrothiophenium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(4-n-butoxyphenyl)tetrahydrothiophenium trifluoromethanesulfonate, 1-(4-n-butoxyphenyl)tetrahydrothiophenium nonafluoro-n-butanesulfonate, 1-(4-n-butoxyphenyl)tetrahydrothiophenium perfluoro-n-octanesulfonate, 1-(4-methoxynaphthalen-1-yl)tetrahydrothiophenium trifluoromethanesulfonate, 1-(4-methoxynaphthalen-1-yl)tetrahydrothiophenium nonafluoro-n-butanesulfonate, 1-(4-methoxynaphthalen-1-yl)tetrahydrothiophenium perfluoro-n-octanesulfonate, 1-(4-ethoxynaphthalen-1-yl)tetrahydrothiophenium trifluoromethanesulfonate, 1-(4-ethoxynaphthalen-1-yl)tetrahydrothiophenium nonafluoro-n-butanesulfonate, 1-(4-ethoxynaphthalen-1-yl)tetrahydrothiophenium perfluoro-n-octanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(2-naphthalen-2-yl-2-oxoethyl)tetrahydrothiophenium trifluoromethanesulfonate, 1-(2-naphthalen-2-yl-2-oxoethyl)tetrahydrothiophenium nonafluoro-n-butanesulfonate, and 1-(2-naphthalen-2-yl-2-oxoethyl)tetrahydrothiophenium perfluoro-n-octanesulfonate.

Of these acid generators (3), triphenylsulfonium nonafluoro-n-butanesulfonate, triphenylsulfonium perfluoro-n-octanesulfonate, 1-(3,5-dimethyl-4-hydroxyphenyl)tetrahydrothiophenium nonafluoro-n-butanesulfonate, 1-(3,5-dimethyl-4-hydroxyphenyl) tetrahydrothiophenium perfluoro-n-octanesulfonate, 1-(4-hydroxynaphthalen-1-yl)tetrahydrothiophenium nonafluoro-n-butanesulfonate, 1-(4-hydroxynaphthalen-1-yl)tetrahydrothiophenium perfluoro-n-octanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(2-naphthalen-2-yl-2-oxoethyl)tetrahydrothiophenium nonafluoro-n-butanesulfonate, 1-(2-naphthalen-2-yl-2-oxoethyl)tetrahydrothiophenium perfluoro-n-octanesulfonate, and the like are particularly preferable.

In the present invention, the acid generator (3) may be used either individually or in combination of two or more.

In the present invention, the following photoacid generators (hereinafter referred to as "other acid generators") can be used in combination with the acid generator (3).

As examples of the other acid generators, onium salts, halogen-containing compounds, diazoketone compounds, sulfone compounds, and sulfonate compounds can be given.

Examples of these other acid generators are given below.
Onium Salt

As examples of the onium salts, iodonium salt, sulfonium salt, phosphonium salt, diazonium salt, and pyridinium salt can be given.

Specific examples of the onium salt include: diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl) iodonium perfluoro-n-octanesulfonate, cyclohexyl-2-oxocyclohexyl-methylsulfonium trifluoromethanesulfonate, dicyclohexyl-2-oxocyclohexylsulfonium trifluoromethanesulfonate, and 2-oxocyclohexyldimethylsulfonium trifluoromethanesulfonate.
Halogen-containing Compound As examples of the halogen-containing compound, haloalkyl group-containing hydrocarbon compounds, and haloalkyl group-containing heterocyclic compounds can be given.

As specific examples of the halogen-containing compound, (trichloromethyl)-s-triazine derivatives such as phenylbis(trichloromethyl)-s-triazine, 4-methoxyphenylbis(trichloromethyl)-s-triazine, and 1-naphthylbis (trichloromethyl)-s-triazine, and 1,1-bis(4-chlorophenyl)-2,2,2-trichloroethane can be given.

Diazoketone Compound

As examples of the diazoketone compound, 1,3-diketo-2-diazo compounds, diazobenzoquinone compounds, and diazonaphthoquinone compounds can be given.

As specific examples of the diazoketone compound, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1,2-naphthoquinonediazido-4-sulfonate or 1,2-naphthoquinonediazido-5-sulfonate of 1,1,1-tris(4-hydroxyphenyl)ethane can be given.

Sulfone Compound

As examples of the sulfone compound, β-ketosulfone, β-sulfonylsulfone, and α-diazo compounds of these compounds can be given.

As specific examples of the sulfone compound, 4-trisphenacylsulfone, mesitylphenacylsulfone, and bis(phenylsulfonyl)methane can be given.

Sulfonate Compound

As examples of the sulfonate compound, alkyl sulfonate, alkylimide sulfonate, haloalkyl sulfonate, aryl sulfonate, and imino sulfonate can be given.

As specific examples of the sulfone compound, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimide trifluoromethanesulfonate, N-hydroxysuccinimide nonafluoro-n-butanesulfonate, N-hydroxysuccinimide perfluoro-n-octanesulfonate, 1,8-naphthalenedicarboxylic acid imide trifluoromethanesulfonate, 1,8-naphthalenedicarboxylic acid imide nonafluoro-n-butanesulfonate, and 1,8-naphthalenedicarboxylic acid imide perfluoro-n-octanesulfonate can be given.

Of these other acid generators, diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimido trifluoromethanesulfonate, N-hydroxysuccinimide nonafluoro-n-butanesulfonate, N-hydroxysuccinimide perfluoro-n-octanesulfonate, 1,8-naphthalenedicarboxylic acid imide trifluoromethanesulfonate, and the like are preferable.

These other acid generators may be used either individually or in combination of two or more.

In the present invention, the amount of the acid generator (B) is usually 0.1–20 parts by weight, and preferably 0.5–10 parts by weight of 100 parts by weight of the resin (A) in order to ensure sensitivity and developability of the resist. If the amount of the acid generator (B) is less than 0.1 part by weight, sensitivity and developability of the resulting resist may be decreased. If the amount exceeds 20 parts by weight, it may be difficult to obtain a rectangular resist pattern due to a decrease in transparency to radiation.

When the acid generator (3) and the other acid generators are used in combination as the acid generator (B), the content of the other acid generators is preferably 80 wt % or less, and more preferably 60 wt % or less of the total amount of the acid generator (3) and the other acid generators.

Solvent (C)

The radiation-sensitive resin composition of the present invention comprises propylene glycol monomethyl ether acetate, γ-butyrolactone, and cyclohexanone as solvents.

Propylene glycol monomethyl ether acetate contributes to excellent wettability of the resulting radiation-sensitive resin composition to substrates, which is the property very effective for obtaining a resist with excellent film thickness uniformity. On the other hand, if incorporated in a large amount, the propylene glycol monomethyl ether acetate may impair storage stability of the composition and may produce foreign matters in the composition during storage. γ-Butyrolactone is a solvent very effective for storage stability of the composition and resist pattern configuration. However, this solvent may impair wettability of the composition to substrates, if too large an amount is incorporated. Cyclohexanone is a solvent effective for storage stability of the composition. This solvent does not have a problem of wettability decrease even if incorporated in a large amount. A radiation-sensitive resin composition excelling in pattern configuration, film thickness uniformity, and storage stability can be obtained by combining these three solvents.

The amounts for these solvents, in terms of the total amount of the solvent, are usually 10–89 wt %, and preferably 15–79 wt % for propylene glycol monomethyl ether acetate; usually 1–40 wt %, and preferably 1–10 wt % for γ-butyrolactone; and usually 10–89 wt %, and preferably 20–84 wt % for cyclohexanone.

The radiation-sensitive resin composition of the present invention may contain solvents other than the above solvents to the extent that the effect of the present invention is not adversely affected. Examples of such other solvents include: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones other than cyclohexanone such as cyclopentanone, 3-methylcyclopentanone, 2-methylcyclohexanone, 2,6-dimethylcyclohexanone, and isophorone; propylene glycol monoalkyl ether acetates other than propylene glycol monomethyl ether acetate such as propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; and alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethoxyethyl acetate, hydroxyethyl acetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methylpyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, ethylene carbonate, and propylene carbonate.

These solvents may be used either individually or in combinations of two or more.

The radiation-sensitive resin composition of the present invention is made into a composition solution by dissolving the composition in the above solvents so that the total solid content is usually 5–50 wt %, and preferably 5–25 wt %, and filtering the solution using a filter with a pore diameter of about 0.2 μm, for example. It is particularly preferable to prepare the composition solution by circulating the solution through a filter with a pore diameter of about 0.05 μm.

Additives (D)

The radiation-sensitive resin composition of the present invention preferably comprises a polycyclic compound of the formula —COOR$^9$ having a molecular weight of 1,000 or less (hereinafter referred to as "additive (D)") to reduce fluctuations in the line width of line patterns due to varied densities of line-and-space patterns, wherein R$^9$ represents a hydrogen atom, a linear or branched, substituted or unsubstituted alkyl group having 1–20 carbon atoms, a substituted or unsubstituted monovalent alicyclic hydrocarbon group having 3–20 carbon atoms, or a group —CH$_2$COOR$^{10}$, wherein R$^{10}$ represents a hydrogen atom, a linear or branched, substituted or unsubstituted alkyl group having 1–20 carbon atoms, or a substituted or unsubstituted monovalent alicyclic hydrocarbon group having 3–20 carbon atoms.

When two or more —COOR$^9$ groups are present in the additive (D), the two or more R$^9$ groups may be either identical or different.

Given as examples of alkyl groups having 1–20 carbon atoms which may have a substituent represented by R$^9$ in the additives (D) are unsubstituted linear or branched alkyl groups such as a methyl group, ethyl group, n-propyl group, i-propyl group, n-butyl group, 2-methyl propyl group, 1-methyl propyl group, t-butyl group, n-pentyl group, n-hexyl group, n-heptyl group, n-octyl group, n-decyl group, n-dodecyl group, n-tetradecyl group, n-hexadecyl group, n-octadecyl group, n-eicosyl group, cyclopentyl group, cyclohexyl group, and cyclooctyl group; and the groups obtained by substituting one or more hydrogen atoms on these unsubstituted linear or branched alkyl groups with a hydroxyl group; carboxyl group; oxo group; hydroxyalkyl groups having 1–4 carbon atoms such as a hydroxymethyl group, hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl groups having 1–4 carbon atoms such as a methoxy group, ethoxy group, n-propoxy group, i-propoxy group, n-butoxy group, 2-methylpropoxy group, 1-methylpropoxy group, and t-butoxy group; cyanoalkyl groups having 2–5 carbon atoms such as a cyanomethyl group, 2-cyanoethyl group, 3-cyanopropyl group, and 4-cyanobutyl group; and the like.

As examples of the monovalent alicyclic hydrocarbon group having 3–20 carbon atoms represented by R$^9$, which may be substituted groups containing an unsubstituted alicyclic ring derived from cycloalkanes such as a norbornane, tricyclodecane, tetracyclododecane, adamantane, and cycloalkanes such as a cyclobutane, cyclopentane, cyclohexane, cycloheptane, and cyclooctane; groups in which the above unsubstituted alicyclic ring is substituted with one or more groups such as a hydroxyl group; carboxyl group; oxo group; hydroxyalkyl groups having 1–4 carbon atoms such as a hydroxymethyl group, hydroxyethyl group, 1-hydroxypropyl group, 2-hydroxypropyl group, 3-hydroxypropyl group, 1-hydroxybutyl group, 2-hydroxybutyl group, 3-hydroxybutyl group, and 4-hydroxybutyl group; alkoxyl groups having 1–4 carbon atoms such as a methoxy group, ethoxy group, n-propoxy group, i-propoxy group, n-butoxy group, 2-methylpropoxy group, 1-methylpropoxy group, and t-butoxy group; and cyanoalkyl groups having 2–5 carbon atoms such as a cyanomethyl group, 2-cyanoethyl group, 3-cyanopropyl group, and 4-cyanobutyl group can be given.

As examples of the linear or branched alkyl group having 1–20 carbon atoms which may be substituted and the monovalent alicyclic hydrocarbon group having 3–20 carbon atoms which may be substituted represented by R$^{10}$, the above groups described for R$^9$ can be given.

As R$^9$ in the polycyclic compound (D), a hydrogen atom, 1-methylpropyl group, t-butyl group, 1-methylpropoxycarbonylmethyl group, t-butoxycarbonylmethyl group, and the like are preferable. Of these, a t-butyl group, a t-butoxycarbonylmethyl group, and the like are particularly preferable.

In the case where R$^9$ in the polycyclic compound (D) is a 1-branched alkyl group or a substituted derivative of the 1-branched alkyl group, R$^9$ dissociates in the presence of an acid. The group —CH$_2$COOR$^{10}$ represented by R$^9$ dissociates by itself in the presence of an acid. In addition, when R$^{10}$ is a 1-branched alkyl group or the substitution derivative thereof, R$^{10}$ also dissociates in the presence of an acid. In these cases, —COOR$^9$ and —COO—CH$_2$COOR$^{10}$ in the polycyclic compound (D) form acid-dissociable groups.

As examples of the additive (D), the compounds of the following formula (4) (hereinafter referred to as "polycyclic compound (D4)") and the compounds of the following formula (5) (hereinafter referred to as "polycyclic compound (D5)") can be given.

(4)

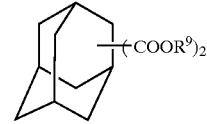

-continued (5)

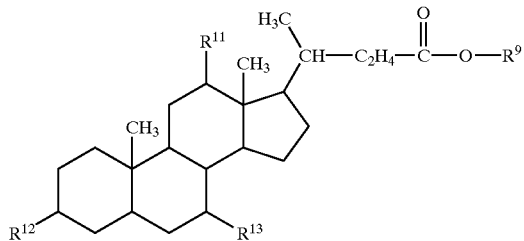

wherein $R^{11}$, $R^{12}$, and $R^{13}$ individually represent a hydrogen atom or a hydroxyl group, provided that at least one of the groups $R^{11}$, $R^{12}$, and $R^{13}$ is a hydroxyl group.

As specific examples of the polycyclic compound (D4), di-t-butyl 1,2-adamantanedicarboxylate, di-t-butyl 1,3-adamantanedicarboxylate, di-t-butyl 1,4-adamantanedicarboxylate, di-t-butyl 2,2-adamantanedicarboxylate, di-t-butyl 2,4-adamantanedicarboxylate, di-t-butyl 2,9-adamantanedicarboxylate, di-t-butoxycarbonylmethyl 1,2-adamantanedicarboxylate, di-t-butoxycarbonylmethyl 1,3-adamantanedicarboxylate, di-t-butoxycarbonylmethyl 1,4-adamantanedicarboxylate, di-t-butoxycarbonylmethyl 2,2-adamantanedicarboxylate, di-t-butoxycarbonylmethyl 2,4-adamantanedicarboxylate, di-t-butoxycarbonylmethyl 2,9-adamantanedicarboxylate, 1-t-butoxycarbonyl-2-t-butoxycarbonylmethoxycarbonyladamantane, 1-t-butoxycarbonyl-3-t-butoxycarbonylmethoxycarbonyladamantane, 1-t-butoxycarbonyl-4-t-butoxycarbonylmethoxycarbonyladamantane, 2-t-butoxycarbonyl-2-t-butoxycarbonylmethoxycarbonyladamantane, 2-t-butoxycarbonyl-4-t-butoxycarbonylmethoxycarbonyladamantane, 2-t-butoxycarbonyl-9-t-butoxycarbonylmethoxycarbonyladamantane, 1-t-butoxycarbonylmethoxycarbonyl-2-t-butoxycarbonyladamantane, and 1-t-butoxycarbonylmethoxycarbonyl-4-t-butoxycarbonyladamantane can be given.

Of these polycyclic compounds (D4), di-t-butyl 1,3-adamantanedicarboxylate, di-t-butoxycarbonylmethyl 1,3-adamantanedicarboxylate, and the like are preferable.

The polycyclic compound (D4) is synthesized as follows. For example, di-t-butyl 1,3-adamantanedicarboxylate is synthesized by dissolving 1,3-adamantanedicarboxylic acid in tetrahydrofuran in a nitrogen atmosphere, adding trifluoroacetic anhydride dropwise to the solution while cooling with ice, stirring the mixture at room temperature, adding a tetrahydrofuran solution of t-butanol to the mixture while cooling with ice, and stirring the mixture to react at room temperature overnight. Di-t-butoxycarbonylmethyl 1,3-adamantanedicarboxylate is synthesized by allowing 1,3-adamantanedicarboxylic acid to react with t-butyl bromoacetate in the presence of a potassium carbonate catalyst in tetrahydrofuran.

As specific examples of the polycyclic compound (D5), lithocholic acid and derivatives of lithocholic acid such as a methyl lithocholate, ethyl lithocholate, n-propyl lithocholate, i-propyl lithocholate, n-butyl lithocholate, 2-methylpropyl lithocholate, 1-methylpropyl lithocholate, t-butyl lithocholate, cyclopentyl lithocholate, cyclohexyl lithocholate, γ-butyrolactone lithocholate, mevaloniclactone lithocholate, methoxycarbonylmethyl lithocholate, ethoxycarbonylmethyl lithocholate, n-propoxycarbonylmethyl lithocholate, i-propoxycarbonylmethyl lithocholate, n-butoxycarbonylmethyl lithocholate, 2-methylpropoxycarbonylmethyl lithocholate, 1-methylpropoxycarbonylmethyl lithocholate, t-butoxycarbonylmethyl lithocholate, cyclopentyloxycarbonylmethyl lithocholate, and cyclohexyloxycarbonylmethyl lithocholate; deoxycholic acid and derivatives of deoxycholic acid such as a methyl deoxycholate, ethyl deoxycholate, n-propyl deoxycholate, i-propyl deoxycholate, n-butyl deoxycholate, 2-methylpropyl deoxycholate, 1-methylpropyl deoxycholate, t-butyl deoxycholate, cyclopentyl deoxycholate, cyclohexyl deoxycholate, γ-butyrolactone deoxycholate, mevaloniclactone deoxycholate, methoxycarbonylmethyl deoxycholate, ethoxycarbonylmethyl deoxycholate, n-propoxycarbonylmethyl deoxycholate, i-propoxycarbonylmethyl deoxycholate, n-butoxycarbonylmethyl deoxycholate, 2-methylpropoxycarbonylmethyl deoxycholate, 1-methylpropoxycarbonylmethyl deoxycholate, t-butoxycarbonylmethyl deoxycholate, cyclopentyloxycarbonylmethyl deoxycholate, and cyclohexyloxycarbonylmethyl deoxycholate; ursodeoxycholic acid and derivatives of ursodeoxycholic acid such as a methyl ursodeoxycholate, ethyl ursodeoxycholate, n-propyl ursodeoxycholate, i-propyl ursodeoxycholate, n-butyl ursodeoxycholate, 2-methylpropyl ursodeoxycholate, 1-methylpropyl ursodeoxycholate, t-butyl ursodeoxycholate, cyclopentyl ursodeoxycholate, cyclohexyl ursodeoxycholate, γ-butyrolactone ursodeoxycholate, mevaloniclactone ursodeoxycholate, methoxycarbonylmethyl ursodeoxycholate, ethoxycarbonylmethyl ursodeoxycholate, n-propoxycarbonylmethyl ursodeoxycholate, i-propoxycarbonylmethyl ursodeoxycholate, n-butoxycarbonylmethyl ursodeoxycholate, 2-methylpropoxycarbonylmethyl ursodeoxycholate, 1-methylpropoxycarbonylmethyl ursodeoxycholate, t-butoxycarbonylmethyl ursodeoxycholate, cyclopentyloxycarbonylmethyl ursodeoxycholate, and cyclohexyloxycarbonylmethyl ursodeoxycholate; and cholic acid and derivatives of cholic acid such as methyl cholate, ethyl cholate, n-propyl cholate, i-propyl cholate, n-butyl cholate, 2-methylpropyl cholate, 1-methylpropyl cholate, t-butyl cholate, cyclopentyl cholate, cyclohexyl cholate, γ-butyrolactone cholate, mevaloniclactone cholate, methoxycarbonylmethyl cholate, ethoxycarbonylmethyl cholate, n-propoxycarbonylmethyl cholate, i-propoxycarbonylmethyl cholate, n-butoxycarbonylmethyl cholate, 2-methylpropoxycarbonylmethyl cholate, 1-methylpropoxycarbonylmethyl cholate, t-butoxycarbonylmethyl cholate, cyclopentyloxycarbonylmethyl cholate, and cyclohexyloxycarbonylmethyl cholate can be given.

Of these polycyclic compounds (D5), t-butyl lithocholate, γ-butyrolactone lithocholate, t-butoxycarbonylmethyl lithocholate, t-butyl deoxycholate, γ-butyrolactone deoxycholate, t-butoxycarbonylmethyl deoxycholate, t-butyl ursodeoxycholaate, γ-butyrolactone ursodeoxycholaate, t-butoxycarbonylmethyl ursodeoxycholaate, t-butyl cholate, γ-butyrolactone cholate, t-butoxycarbonylmethyl cholate, and the like are preferable.

The polycyclic compound (D5) can be synthesized by reacting a corresponding steroid carboxylic acid and t-butyl bromoacetate in the presence of potassium carbonate, for example.

As a polycyclic compound (D) in the present invention, a compound having an adamantane skeleton, norbornane skeleton, or steroid skeleton in the molecule is preferable, with a compound having an adamantane skeleton or a steroid skeleton being particularly preferable.

In the present invention, the polycyclic compounds (D) may be used either individually or in combination of two or more.

The amount of the polycyclic compound (D) to be used is usually 1–20 parts by weight, preferably 1–15 parts by weight, and still more preferably 1–10 parts by weight for 100 parts by weight of the resin (A). The amount of polycyclic compound (D) less than one part by weight may decrease the effect of reducing fluctuations in the line width of line patterns due to varied density of line-and-space patterns. If the amount exceeds 20 parts by weight, heat resistance and adhesion to substrates tend to decrease.

Other Additives

Various other additives such as acid diffusion controllers, surfactants, and sensitizers can be optionally added to the radiation-sensitive resin composition of the present invention.

The acid diffusion controllers control diffusion of an acid generated from the acid generator upon exposure in the resist film to hinder undesired chemical reactions in the unexposed area.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and post exposure heat treatment, whereby a composition with remarkably superior process stability can be obtained.

As the acid diffusion controllers, nitrogen-containing organic compounds of which the basicity does not change due to exposure or heat treatment during formation of a resist pattern are preferable.

As the organic compounds containing nitrogen, for example, compounds of the following formula (6),

(6)

wherein $R^{14}$ individually represents a hydrogen atom, a substituted or unsubstituted, linear, branched, or cyclic alkyl group, substituted or unsubstituted aryl group, or substituted or unsubstituted aralkyl group (hereinafter called "nitrogen-containing compounds (a)"), compounds having two nitrogen atoms in the molecule (hereinafter called "nitrogen-containing compounds (b)"), polyamino compounds and polymers having at least three nitrogen atoms (hereinafter called "nitrogen-containing compounds (c)"), compounds containing an amide group, urea compounds, heterocyclic compounds containing a nitrogen atom, and the like can be given.

As examples of the nitrogen-containing compounds (a), mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine can be given.

Examples of the nitrogen-containing compound (b) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis [1-(4-aminophenyl)-1-methylethyl]benzene, bis(2-dimethylaminoethyl)ether, and bis(2-diethylaminoethyl)ether.

As examples of the nitrogen-containing compound (c), polyethyleneimine, polyallylamine, and a polymer of 2-dimethylaminoethylacrylamide can be given.

As examples of the amide group-containing compound, N-t-butoxycarbonyl group-containing amino compounds such as n-octylamine, N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, and N-methylpyrrolidone can be given.

As examples of the urea compound, urea, methylurea, 1,1-dimethylurea, 1,3-dimethylurea, 1,1,3,3-tetramethylurea, 1,3-diphenylurea, and tri-n-butylthiourea can be given.

Examples of the nitrogen-containing heterocyclic compounds include: imidazoles such as imidazole, 4-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine and 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these nitrogen-containing organic compounds, the nitrogen-containing compounds (a), amide group-containing compounds, nitrogen-containing heterocyclic compounds, and the like are preferable.

The acid diffusion controllers may be used either individually or in combination of two or more.

Surfactants improve applicability, striation, developability, and the like.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more.

The sensitizers absorb radiation energy and transmit the energy to the acid generator (B), thereby increasing the amount of an acid to be generated upon exposure. The sensitizers improve apparent sensitivity of the radiation-sensitive resin composition.

As examples of the sensitizers, acetophenones, benzophenones, naphthalenes, biacetyl, Eosine, Rose Bengal, pyrenes, anthracenes, and phenothiazines can be given.

These sensitizers may be used either individually or in combinations of two or more.

Addition of dyes or pigments visualizes a latent image in the exposed area, thereby decreasing the effects of halation during exposure. Use of adhesion improvers improves adhesion to the substrates.

As other additives, low molecular weight alkali solubility controllers containing an alkali-soluble resin and/or acid dissociable protecting group, halation inhibitors, preservation stabilizers, antifoaming agents, and the like can be given.

Formation of Resist Pattern

The radiation-sensitive resin composition of the present invention is particularly useful as a chemically-amplified resist.

In the chemically-amplified resist, an acid-dissociable group in the resin (A) dissociates by the action of an acid generated from the acid generator (B) upon exposure, thereby producing a carboxyl group. As a result, solubility of the exposed part of the resist in an alkaline developer increases, whereby the exposed part is dissolved in the alkaline developer and removed to obtain a positive-tone resist pattern.

A resist pattern is formed from the radiation-sensitive resin composition of the present invention by applying the composition solution to, for example, substrates such as a silicon wafer and a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, charged particles, or the like are appropriately selected depending on types of the acid generator. It is particularly preferable to use ultraviolet rays represented by an ArF excimer laser (wavelength: 193 nm) and KrF excimer laser (wavelength: 248 nm).

In the present invention, it is preferable to perform post-exposure bake (hereinafter called "PEB"). PEB ensures smooth dissociation of the acid-dissociable group in the resin (A). The heating temperature for the PEB is usually 30–200° C., and preferably 50–170° C., although the heating conditions are changed depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No.6-12452, for example. Moreover, a protection film may be formed on the resist film as disclosed in Japanese Patent Publication No. 5-188598 or the like in order to prevent the effects of basic impurities and the like in an environmental atmosphere. These techniques may be employed in combination.

The exposed resist film is then developed to form a specific resist pattern.

As examples of a developer used for development, alkaline aqueous solutions prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene are preferable.

The concentration of the alkaline aqueous solution is usually 10 wt % or less. If the concentration of the alkaline aqueous solution exceeds 10 wt %, an unexposed part may be dissolved in the developer.

Organic solvents or the like may be added to the developer containing the alkaline aqueous solution.

As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, and dimethylformamide can be given.

These organic solvents may be used either individually or in combination of two or more.

The amount of the organic solvent to be used is preferably 100 vol % or less of the alkaline aqueous solution. If the amount of the organic solvent exceeds 100 vol %, the exposed part may remain undeveloped due to a decrease in developability.

In addition, surfactants or the like may be added to the developer containing the alkaline aqueous solution in an appropriate amount.

After development using the alkaline aqueous solution developer, the resist film is generally washed with water and dried.

EXAMPLES

The present invention is described below in more detail by examples. However, these examples should not be construed as limiting the present invention. In the examples, "part" refers to "part by weight" unless otherwise indicated.

Measurement and evaluation in the examples and comparative examples were carried out according to the following procedures.

Mw

Mw was measured by gel permeation chromatography (GPC) using GPC columns (manufactured by Tosoh Corp., G2000HXL×2, G3000HXL×1, G4000HXL×1) under the following conditions. Flow rate: 1.0 ml/minute, eluate: tetrahydrofuran, column temperature: 40° C., standard reference material: monodispersed polystyrene Sensitivity A solution composition was applied to a silicon wafer with a 820 Å thickness ARC25 film (manufactured by Brewer Science Inc.) coated on the surface by spin coating and post-baked on a hot plate under the conditions shown in Table 2 to obtain a resist coating. The coating was exposed to radiation through a mask pattern using an ArF excimer laser exposure apparatus (manufactured by Nikon Corp., lens numerical aperture: 0.55, wavelength: 193 nm). After performing PEB under the conditions shown in Table 2, the resist film was developed at 25° C. for 60 seconds in a 2.38 wt % tetramethylammonium hydroxide aqueous solution, washed with water, and dried to form a positive-tone resist pattern. An optimum dose at which a line-and-space (1L1S) pattern with a line width of 0.16 μm was formed was taken as sensitivity.

Resolution

Minimum dimensions of the resist pattern resolved at the optimum dose were taken as the resolution.

Adhesion to Substrate

A positive tone resist pattern with a 0.25 μm line-and-space (1L1S), obtained by washing and drying after development, was observed for pattern adhesion conditions by a scanning electron microscope. A specimen without peel-off, embossment, or the like was evaluated as "Good", whereas a specimen with these problems was evaluated as "Bad".

Film Thickness Uniformity

A resist film with an average film thickness of 0.50 μm was formed by applying the radiation-sensitive resin composition to a silicone wafer with a diameter of 6 inches by spin coating using a developing application apparatus MARK-8 (manufactured by Tokyo Electron Ltd.). The thickness of this resist film was measured using Lambda Ace, model VL-M6000-LS (manufactured by Dainippon Screen Mfg. Co., Ltd.) at a total of 25 points, each point at an interval of 1 cm along the orientation flat direction from the center of the wafer, the horizontal direction, and the opposite direction to the orientation flat direction, and the center of the wafer, as shown in FIG. 1. The film thickness uniformity was judged to be bad when neither the inequality (maximum film thickness−average film thickness)≦50 Å nor (average film thickness−maximum film thickness)=≦50 Å are satisfied.

Storage Stability

Particles of foreign matters with a diameter of 0.25 μm or larger in the solution of the radiation-sensitive resin composition immediately after preparation and after storing for one month at room temperature were counted using a particle counter KL-20A (manufactured by Rion Co., Ltd.) at a flow rate of 10 ml/min. The compositions with a foreign matter content of 200 or less particles per 10 ml were regarded as having good storage stability.

Resin Synthesis Example 1

A monomer solution was prepared by dissolving 56.31 g (55 mol %) of 2-methyl-2-adamantyl methacrylate, 43.69 g (45 mol %) of a compound of the following formula (7) (hereinafter referred to as "methacrylate (a)"), and 4.02 g of azobis(methylisovalerate) in 200 g of 2-butanone.

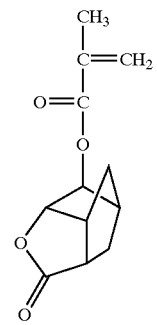

(7)

A 1,000 ml three-necked flask containing 100 g of 2-butanone was purged with nitrogen for 30 minutes and heated to 80° C. while stirring.

Then, the above monomer solution was added to the flask using a dripping funnel at a rate of 10 ml/5 min. The polymerization reaction was carried out for six hours after initiation of dripping. After the polymerization, the polymer solution was cooled with water to 30° C. or lower and added dropwise to 2,000 g of methanol. White precipitate produced was collected by filtration. The white powder was washed with 400 g of methanol twice, collected by filtration, and dried at 50° C. for 17 hours to obtain 69 g of a white powder resin (yield: 69 wt %). This resin was a copolymer with a Mw of 13,200 and a mol % ratio of the recurring units derived from 2-methyl-2-adamantyl methacrylate and methacrylate (a) of 50.1: 49.9. This resin is referred to as a "resin (A-1)".

Resin Synthesis Example 2

71 g (yield 71 wt %) of a white resin powder was prepared in the same manner as in the Resin Synthesis Example 1, except for using a monomer solution which was prepared by dissolving 37.06 g (40 mol %) of 1-ethylcyclohexyl methacrylate, 62.94 g (60 mol %) of methacrylate (a), and 4.34 g of azobis(methylisovalerate) in 200 g of 2-butanone.

This resin was a copolymer with a Mw of 12,200 and a mol % ratio of the recurring units derived from 1-ethylcyclohexyl methacrylate and methacrylate (a) of 41.2: 58.8. This resin is referred to as a "resin (A-2)".

Resin Synthesis Example 3

70 g (yield 70 wt %) of a white resin powder was prepared in the same manner as in the Resin Synthesis Example 1, except for using a monomer solution which was prepared by dissolving 52.78 g (50 mol %) of 2-ethyl-2-adamantyl methacrylate, 47.22 g (50 mol %) of methacrylate (a), and 3.91 g of azobis(methylisovalerate) in 200 g of 2-butanone.

This resin was a copolymer with a Mw of 12,500 and a mol % ratio of the recurring units derived from 2-ethyl-2-adamantyl methacrylate and methacrylate (a) of 40.5:59.5. This resin is referred to as a "resin (A-3)".

Resin Synthesis Example 4

73 g (yield 73 wt %) of a white resin powder was prepared in the same manner as in the Resin Synthesis Example 1, except for using a monomer solution which was prepared by dissolving 50.55 g (50 mol %) of 2-methyl-2-adamantyl methacrylate, 25.49 g (25 mol %) of 3-hydroxy-1-adamantyl, 23.79 g (25 mol %) of methacrylate (a), and 3.98 g of azobis(methylisovalerate) in 200 g of 2-butanone.

This resin was a copolymer with a Mw of 10,000 and a mol % ratio of the recurring units derived from 2-methyl-2-adamantyl methacrylate, 3-hydroxy-1-adamantyl methacrylate, and the methacrylate (a) of 45.3:25.1:29.6. This resin is referred to as a "resin (A-4)".

Resin Synthesis Example 5

73 g (yield 73 wt %) of a white resin powder was prepared in the same manner as in the Resin Synthesis Example 1, except for using a monomer solution which was prepared by dissolving 52.00 g (50 mol %) of 2-ethyl-2-adamantyl methacrylate, 24.74 g (25 mol %) of 3-hydroxy-1-adamantyl methacrylate, 23.26 g (25 mol %) of methacrylate (a), and 4.02 g of azobis(methylisovalerate) in 200 g of 2-butanone.

This resin was a copolymer with a Mw of 10,900 and a mol % ratio of the recurring units derived from 2-ethyl-2-adamantyl methacrylate, 3-hydroxy-1-adamantyl methacrylate, and the methacrylate (a) of 44.3: 25.6: 30.0. This resin is referred to as a "resin (A-5)".

Resin Synthesis Example 6

71 g (yield 71 wt %) of a white resin powder was prepared in the same manner as in the Resin Synthesis Example 1, except for using a monomer solution which was prepared by dissolving 40.4 g (42 mol %) of 1-ethylcyclohexyl methacrylate, 58.29 g (54 mol %) of methacrylate (a), and 4.47 g of azobis(methylisovalerate) in 200 g of 2-butanone.

This resin was a copolymer with a Mw of 11,000 and a mol % ratio of the recurring units derived from 1-ethylcyclohexyl methacrylate, methacrylate (a), and methacrylic acid of 38.4: 57.4: 4.2. This resin is referred to as a "resin (A-6)".

Examples 1–5 and Comparative Examples 1–2

Each composition solution having components ("part" indicates "part by weight") shown in Table 1 was evaluated. The evaluation results are shown in Table 3.

Components other than the resins (A-1) to (A-5) shown in Table 1 are as follows.

Acid Generator (B)

B-1: 1-(4-n-butoxynaphthalen-1-yl) tetrahydrothiopheniumperfluoro-n-octanesulfonate B-2: 1-(4-n-butoxynaphthalen-1-yl) tetrahydrothiophenium nonafluoro-n-butanesulfonate B-3: 1-(3,5-dimethyl-4-hydroxyphenyl) tetrahydrothiophenium nonafluoro-n-butanesulfonate B-4: triphenylsulfonium nonafluoro-n-butanesulfonate Solvent (C)

C-1: propylene glycol monomethyl ether acetate:γ-butyrolactone:cyclohexanone=47:3:50 (weight ratio)

C-2: propylene glycol monomethyl ether acetate:γ-butyrolactone:cyclohexanone=35:5:60 (weight ratio)

C-3: propylene glycol monomethyl ether acetate:γ-butyrolactone=97:3 (weight ratio)

C-4: propylene glycol monomethyl ether acetate

C-5: propylene glycol monomethyl ether acetate:γ-butyrolactone:cyclohexanone=53:3:44 (weight ratio)

Additive (D)

D-1: t-butoxycarbonylmethyl deoxycholate

D-2: di-t-butyl 1,3-adamantanedicarboxylate

Acid Diffusion Controller

E-1: N-t-butoxycarbonyl-2-phenylbenzimidazole

E-2: 2-phenylbenzimidazole

TABLE 1

| | Resin (A) | Acid generator (B) | Additive (D) | Acid diffusion controller | Solvent (C) |
|---|---|---|---|---|---|
| Example 1 | A-1 (90) A-2 (10) | B-1 (5) | D-1 (8) | E-1 (0.60) | C-1 (800) |
| Example 2 | A-1 (30) A-5 (70) | B-1 (5) | D-1 (8) | E-1 (0.60) | C-2 (800) |
| Example 3 | A-3 (50) A-5 (50) | B-2 (7) | — | E-2 (0.80) | C-1 (800) |
| Example 4 | A-1 (100) | B-3 (5) B-4 (1) | D-2 (3) | E-2 (0.40) | C-1 (800) |
| Example 5 | A-4 (60) A-5 (40) | B-2 (7) | — | E-2 (0.80) | C-2 (800) |
| Example 6 | A-1 (90) A-6 (10) | B-1 (5) | D-1 (9) | E-1 (0.25) | C-1 (1400) |
| Comparative Example 1 | A-1 (100) | B-1 (5) | D-1 (8) | E-1 (0.60) | C-4 (800) |
| Comparative Example 2 | A-3 (50) A-5 (50) | B-3 (5) B-4 (1) | — | E-2 (0.40) | C-3 (800) |

Value in parentheses indicates parts

TABLE 2

| | Resist coating thickness (μm) | Substrate | PB Temperature (° C.) | PB Time (sec) | PEB Temperature (° C.) | PEB Time (sec) |
|---|---|---|---|---|---|---|
| Example 1 | 0.34 | ARC 25 | 130 | 90 | 130 | 90 |
| Example 2 | 0.34 | ARC 25 | 130 | 90 | 130 | 90 |
| Example 3 | 0.34 | ARC 25 | 130 | 60 | 110 | 90 |
| Example 4 | 0.34 | ARC 25 | 130 | 90 | 130 | 90 |
| Example 5 | 0.34 | ARC 25 | 130 | 60 | 110 | 90 |
| Example 6 | 0.17 | ARC 25 | 126 | 90 | 126 | 90 |
| Comparative Example 1 | 0.34 | ARC 25 | 130 | 90 | 130 | 90 |
| Comparative Example 2 | 0.34 | ARC 25 | 130 | 90 | 130 | 90 |

TABLE 3

| | Sensitivity (J/m$^2$) | Resolution (μm) | Adhesion to substrate | Film thickness uniformity | No. of foreign particles/10 ml Initial | No. of foreign particles/10 ml After one month |
|---|---|---|---|---|---|---|
| Example 1 | 200 | 0.13 | Good | Good | 113 | 189 |
| Example 2 | 250 | 0.13 | Good | Good | 99 | 156 |
| Example 3 | 240 | 0.13 | Good | Good | 72 | 99 |
| Example 4 | 210 | 0.13 | Good | Good | 89 | 112 |
| Example 5 | 260 | 0.13 | Good | Good | 122 | 132 |
| Example 6 | 200 | 0.13 | Good | Good | 79 | 103 |
| Comparative Example 1 | 230 | 0.13 | Good | Good | 108 | 33798 |
| Comparative Example 2 | 250 | 0.13 | Good | Good | 67 | 27398 |

The radiation-sensitive resin composition of the present invention has excellent basic properties as a resist such as high sensitivity, resolution, and pattern forming capability when used as a chemically-amplified resist responsive to active radiation such as deep ultraviolet rays represented by a KrF excimer laser (wavelength: 248 nm) and an ArF excimer laser (wavelength: 193 nm). The resist is particularly characterized by excellent film thickness uniformity and storage stability. The resin composition is suitably used for fabrication of integrated circuit devices that are expected to be more and more miniaturized.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
(A) an alkali insoluble or scarcely alkali-soluble resin having an acid-dissociable protecting group of the following formula [I],

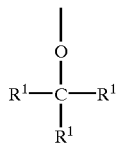

[I]

wherein $R^1$ groups individually represent a monovalent alicyclic hydrocarbon group having 4–20 carbon atoms or a derivative thereof, or a linear or branched alkyl group having 1–4 carbon atoms, provided that at least one of the $R^1$ groups is the monovalent alicyclic hydrocarbon group having 4–20 carbon atoms or a derivative thereof, or any two of the $R^1$ groups form, in combination and together with the carbon atom to which the two $R^1$ groups bond, a divalent alicyclic hydrocarbon group having 4–20 carbon atoms or a derivative thereof, with the remaining $R^1$ group being the linear or branched alkyl group having 1–4 carbon atoms or the monovalent alicyclic hydrocarbon group having 4–20 carbon atoms or the derivative thereof,
(B) a photoacid generator, and
(C) propylene glycol monomethyl ether acetate, γ-butyrolactone, and cyclohexanone as solvents.

2. The radiation-sensitive resin composition according to claim 1, wherein the acid-dissociable protecting group of the formula [I] in the resin (A) is selected from the groups of the following formulas [I-1], [I-2], and [I-3].

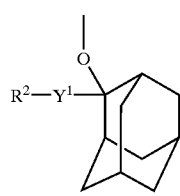

[I-1]

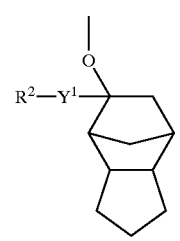

[I-2]

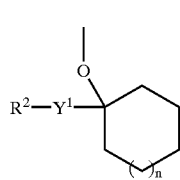

[I-3]

wherein the $R^2$ group individually represents a hydrogen atom, a linear or branched alkyl group having 1–10 carbon atoms, a monovalent oxygen-containing organic group having 1–6 carbon atoms, $Y^1$ individually represents a single bond or a group —$CH_2$—, and n is an integer of 0–2.

3. The radiation-sensitive resin composition according to claim 2, wherein the $R^2$ group in the formulas [I-1], [I-2], and [I-3] is selected from the group consisting of a methyl group, ethyl group, n-butyl group, and n-butoxy group.

4. The radiation-sensitive resin composition according to claim 2, wherein the $Y^1$ in the formulas [I-1], [I-2], and [I-3] is a single bond.

5. The radiation-sensitive resin composition according to claim 2, wherein the n in the formulas [I-1], [I-2], and [I-3] is 0 or 1.

6. The radiation-sensitive resin composition according to claim 2, wherein the acid-dissociable protecting group of the formula [I] in the resin (A) is included in the recurring unit of the following formula (1),

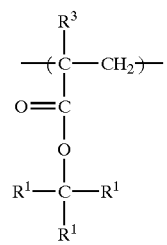

(1)

wherein $R^1$ is the same as defined in the formula [I] and $R^3$ represents a hydrogen atom or a methyl group.

7. The radiation-sensitive resin composition of claim 6, wherein the recurring unit of the formula (1) is 10–60 mol % of the total recurring units in the resin (A).

8. The radiation-sensitive resin composition of claim 6, wherein the group:

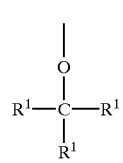

[I]

in the recurring unit (1) is dissociable in the presence of an acid and produces a carboxyl group.

9. The radiation-sensitive resin composition according to claim 6, wherein the resin (A) comprises the recurring unit of the formula (1) and at least one of the recurring units of the following formulas (2-1), (2-2), (2-3), and (2-4),

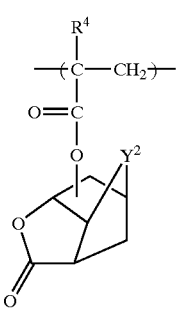

(2-1)

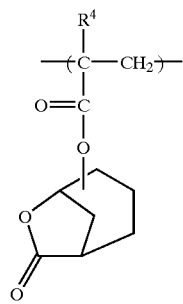

(2-2)

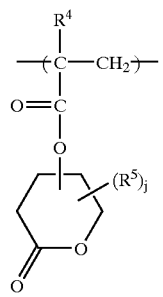

(2-3)

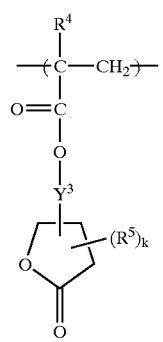

(2-4)

wherein $R^4$ individually represents a hydrogen atom or a methyl group, $Y^2$ represents a group —$CH_2$—, —CH($CH_3$)—, —C($CH_3$)$_2$—, —O—, or —S—, $R^5$ individually represents a linear or branched alkyl group having 1–5 carbon atoms or a linear or branched alkoxyl group having 1–5 carbon atoms, j is an integer of 0 to 4, and k is an integer of 0 to 4; two or more $R^5$ groups, present in the formula (2-3) or formula (2-4), being either the same or different, and $Y^2$ represents a single bond or a group —$CH_2$—.

10. The radiation-sensitive resin composition according to claim 9, wherein the content of the recurring units of the formulas (2-1), (2-2), (2-3), and (2-4) is 10–80 mol % of the total recurring units in the resin (A).

11. The radiation-sensitive resin composition according to claim 1, wherein the photoacid generator (B) comprises a compound of the following formula (3),

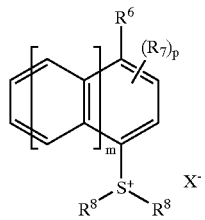

(3)

wherein $R^6$ represents a hydrogen atom, hydroxyl group, linear or branched alkyl group having 1–10 carbon atoms, linear or branched alkoxyl group having 1–10 carbon atoms, or linear or branched alkoxycarbonyl group having 2–11 carbon atoms, $R^7$ indicates a hydrogen atom or a linear or branched alkyl group having 1–10 carbon atoms, two or more $R^7$ groups, if present, being either the same or different, p is an integer of 0–3, $R^8$ individually represents a linear or branched alkyl group having 1–10 carbon atoms, a phenyl group or naphtyl group which may have a substituent, or two $R^8$ groups bond, together with the sulfur atom to which the two $R^8$ groups bond, to form a substituted or unsubstituted 3–11 member cyclic structure, m is an integer of 0–2, and $X^-$ represents a linear or branched perfluoroalkane sulfonic acid anion having 1–10 carbon atoms.

12. The radiation-sensitive resin composition of claim 11, wherein $X^-$ in the formula (3) is at least one anion selected from the group consisting of a trifluoromethanesulfonic acid anion, nonafluoro-n-butanesulfonic acid anion, and perfluoro-n-octanesulfonic acid anion.

13. The radiation-sensitive resin composition of claim 1, further comprising (D) a polycyclic compound of the formula —$COOR^9$, having a molecular weight of 1,000 or less, wherein $R^9$ represents a hydrogen atom, a linear or branched, substituted or unsubstituted alkyl group having 1–20 carbon atoms, a substituted or unsubstituted monovalent alicyclic hydrocarbon group having 3–20 carbon atoms, or a group—$CH_2COOR^{10}$, wherein $R^{10}$ represents a hydrogen atom, a linear or branched, substituted or unsubstituted alkyl group having 1–20 carbon atoms, or a substituted or unsubstituted monovalent alicyclic hydrocarbon group having 3–20 carbon atoms.

14. The radiation-sensitive resin composition of claim 13, wherein the polycyclic compound is selected from the group consisting of the compounds of the following formulas (4) and (5):

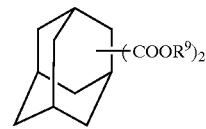

(4)

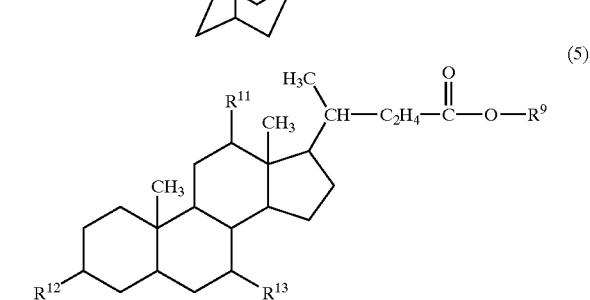

(5)

wherein $R^{11}$, $R^{12}$, and $R^{13}$ individually represent a hydrogen atom or a hydroxyl group, provided that at least one of the groups $R^{11}$, $R^{12}$, and $R^{13}$ is a hydroxyl group.

15. The radiation-sensitive resin composition of claim 13, wherein the content of the polycyclic compound is 1–20 parts by weight per 100 parts by weight of the resin (A).

16. The radiation-sensitive resin composition of claim 1, wherein the content of propylene glycol monomethyl ether acetate, γ-butyrolactone, and cyclohexanone is respectively in the range of 10–89 wt %, 1–40 wt %, and 10–89 wt %.

17. The radiation-sensitive resin composition of claim 1, wherein the resin (A) has a polystyrene-reduced weight average molecular weight determined by gel permeation chromatography of 3,000–30,000.

18. The radiation-sensitive resin composition of claim 1, wherein the composition is dissolved in the solvent to make the solid component concentration in the range of 5 to 50 wt %.

19. The radiation-sensitive resin composition of claim 1, wherein the content of the acid generator (B) is 0.1–20 parts by weight per 100 parts by weight of the resin (A).

* * * * *